(12) United States Patent
Zhou

(10) Patent No.: US 11,757,406 B2
(45) Date of Patent: Sep. 12, 2023

(54) OSCILLATOR CIRCUIT

(71) Applicant: Huawei Technologies Co., Ltd., Guangdong (CN)

(72) Inventor: Yunfang Zhou, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/733,453

(22) Filed: Apr. 29, 2022

(65) Prior Publication Data

US 2022/0263465 A1  Aug. 18, 2022

Related U.S. Application Data

(63) Continuation of application No. PCT/CN2019/114877, filed on Oct. 31, 2019.

(51) Int. Cl.
*H03B 5/12* (2006.01)

(52) U.S. Cl.
CPC ... *H03B 5/1228* (2013.01); *H03B 2200/0088* (2013.01)

(58) Field of Classification Search
CPC .................................................. H03B 5/1228
USPC .................................................. 331/117 FE
See application file for complete search history.

(56) References Cited

U.S. PATENT DOCUMENTS

| 8,344,811 | B2 | 1/2013 | Bao |
| 9,425,737 | B1 | 8/2016 | Bushman et al. |
| 9,735,732 | B1 | 8/2017 | Ferriss et al. |
| 9,819,307 | B2 | 11/2017 | Farazian et al. |
| 2008/0278250 | A1* | 11/2008 | Hung ............... H03B 5/1215 455/552.1 |
| 2016/0036382 | A1* | 2/2016 | Chakraborty ........ H03B 5/1262 331/117 R |
| 2017/0111009 | A1* | 4/2017 | Chiu .................. H03B 5/1212 |
| 2017/0288796 | A1 | 10/2017 | Chakraborty |
| 2018/0219513 | A1* | 8/2018 | Gao .................... H03B 5/1215 |
| 2018/0351559 | A1 | 12/2018 | Shiraishi |
| 2021/0320622 | A1* | 10/2021 | Huang ................... H03B 1/04 |

FOREIGN PATENT DOCUMENTS

| CN | 103684259 A | 3/2014 |
| CN | 106026923 A | 10/2016 |
| CN | 107528542 A | 12/2017 |

(Continued)

*Primary Examiner* — Joseph Chang
(74) *Attorney, Agent, or Firm* — HUAWEI TECHNOLOGIES CO., LTD.

(57) ABSTRACT

An oscillator circuit is provided, which relates to the field of electronic technologies, to improve performance of an oscillator. The oscillator circuit includes: a first amplifier (Am1) and a second amplifier (Am2), where the first amplifier (Am1) and the second amplifier (Am2) are switchable, and the oscillator circuit is operable in an inductive feedback mode or a negative resistance mode through switching. The oscillator circuit further includes a capacitive element and an inductive element, where the inductive element includes a tapped inductor that includes four terminals (V1, V2, V3, and V4), two of the four terminals are coupled to differential inputs of the first amplifier (Am1) and differential outputs of the second amplifier (Am2), and the other two terminals are coupled to differential outputs of the first amplifier (Am1).

15 Claims, 11 Drawing Sheets

(56) References Cited

FOREIGN PATENT DOCUMENTS

| EP | 1845611 A1 | 10/2007 |
|---|---|---|
| KR | 20060078600 A | 7/2006 |
| KR | 20150024682 A | 3/2015 |

* cited by examiner

OSCILLATOR CIRCUIT

CROSS-REFERENCE TO RELATED APPLICATIONS

This application is a continuation of International Application No. PCT/CN2019/114877, filed on Oct. 31, 2019, the disclosure of which is hereby incorporated by reference in its entirety.

TECHNICAL FIELD

This application relates to the field of electronic technologies, and in particular, to an oscillator circuit.

BACKGROUND

With the growth of wireless communication systems such as a cellular system, a wireless local area network (WLAN) system, a satellite communication system, and a global positioning system (GPS), demands for small-sized, low-cost, and high-frequency products have continuously increased. In this regard, voltage controlled oscillators (VCO) play a critical role in communication systems, providing periodic signals required for timing in digital circuits and frequency translation in radio frequency (RF) circuits. A VCO may be embodied as a stand-alone module separate from other circuits or integrated into an application-specific integrated circuit (ASIC), for use in devices such as, but not limited to, mobile phones, base stations, and virtually every communication device. As RF frequencies increase and supply voltages are decreased, it has become increasingly difficult to design VCOs that meet system noise and power requirements while meeting the demands for the small-sized, low-cost, and high-frequency products.

Noise performance of an LC resonant VCO is directly related to a signal power of the LC resonant VCO. The signal power of the LC resonant VCO is proportional to energy stored in an inductor-capacitor (LC) tank. In traditional VCO designs, the energy stored in the LC circuit is proportional to a size of an inductor and a square of a supply voltage of an amplifier in the VCO. As a geometry of a semiconductor device shrinks, the supply voltage of the amplifier needs to be decreased. To compensate for the decrease in voltage, the inductor used in the LC tank also needs to be decreased in size so that performance of noise generated by the VCO remains the same. An increase in required frequency also requires the inductor size to be decreased. However, a decrease in inductor size presents a challenge since a smaller inductor size indicates a decrease in quality factor (Q) and an increase in thermal noise of the VCO.

SUMMARY

This application provides an oscillator circuit, to improve performance of an oscillator. To achieve the foregoing objective, the following technical solutions are used in this application.

According to a first aspect, an oscillator circuit is provided. The oscillator circuit includes: a first amplifier and a second amplifier, where the first amplifier and the second amplifier can be switched by using switches, and the oscillator circuit can operate in an inductive feedback mode or a negative resistance mode through switching; and a resonator, where the resonator includes a capacitive element and an inductive element, the inductive element includes a tapped inductor, the tapped inductor includes four terminals, namely, a first terminal, a second terminal, a third terminal, and a fourth terminal, two of the four terminals are coupled to differential inputs of the first amplifier and differential outputs of the second amplifier, and the other two terminals are coupled to differential outputs of the first amplifier. In the foregoing technical solution, the oscillator circuit can operate in the inductive feedback mode when the first amplifier is switched, by using the switch, to operate, and the oscillator circuit can operate in the negative resistance mode when the second amplifier is switched, by using the switch, to operate. In this way, requirements for noise and power consumption in different scenarios are met, improving performance of the oscillator circuit.

In an embodiment, the first amplifier includes two groups of first coupling transistors with gates coupled together and drains coupled together, and sources of the two groups of first coupling transistors are respectively coupled to a positive power voltage and a negative power voltage through switches. In an embodiment, the first amplifier includes a first p-channel metal-oxide semiconductor (PMOS) transistor, a second PMOS transistor, a first n-channel metal-oxide semiconductor (NMOS) transistor, a second NMOS transistor, a first switch, a second switch, a third switch, and a fourth switch. A gate of the first PMOS transistor and a gate of the first NMOS transistor are both coupled to the first terminal. A drain of the first PMOS transistor and a drain of the first NMOS transistor are both coupled to the third terminal. A drain of the second PMOS transistor and a drain of the second NMOS transistor are both coupled to the second terminal. A gate of the second PMOS transistor and a gate of the second NMOS transistor are both coupled to the fourth terminal. A source of the first PMOS transistor and a source of the second PMOS transistor are coupled to the positive power voltage through the first switch and the second switch, respectively. A source of the first NMOS transistor and a source of the second NMOS transistor are coupled to the negative power voltage through the third switch and the fourth switch, respectively. In the foregoing embodiment, the gates of the coupling transistors in the first amplifier have a larger oscillation amplitude, reducing non-linearity at the drains and enabling the oscillator circuit to have better phase noise.

In an embodiment, the first amplifier includes a first metal-oxide semiconductor (MOS) transistor, a second MOS transistor, a first switch, and a second switch. The first MOS transistor and the second MOS transistor are both PMOS transistors or NMOS transistors. A gate of the first MOS transistor is coupled to the first terminal. A drain of the first MOS transistor is coupled to the third terminal. A drain of the second MOS transistor is coupled to the second terminal. A gate of the second MOS transistor is coupled to the fourth terminal. Sources of the first MOS transistor and the second MOS transistor are coupled to a positive power voltage or a negative power voltage through the first switch and the second switch, respectively. In the foregoing embodiment, the first amplifier has advantages of a simple structure and being easy to implement and control.

In an embodiment, the second amplifier is configured to enable the oscillator circuit to operate in a single-ended negative resistance mode. In an embodiment, the second amplifier includes a third MOS transistor, a fourth MOS transistor, a fifth switch, and a sixth switch. The third MOS transistor and the fourth MOS transistor are both PMOS transistors or NMOS transistors. A drain of the third MOS transistor is coupled to a gate of the fourth MOS transistor through the fifth switch and coupled to the first terminal. A drain of the fourth MOS transistor is coupled to a gate of the third MOS transistor through the sixth switch and coupled to the fourth terminal. A source of the third MOS transistor and a source of the fourth MOS transistor are both coupled to the positive power voltage or the negative power voltage. In the foregoing embodiment, when operating in the single-ended negative resistance mode, the oscillator circuit has low noise, and a structure of the second amplifier is relatively simple.

In an embodiment, the second amplifier is configured to enable the oscillator circuit to operate in a complementary negative resistance mode. In the foregoing embodiment, when operating in the complementary negative resistance mode, the oscillator circuit has low power consumption, which is lower than power consumption of the oscillator circuit operating in the single-ended negative resistance mode.

In an embodiment, the second amplifier includes two groups of second coupling transistors with gates and drains cross-coupled, the drains are coupled by using switches, and sources of the two groups of second coupling transistors are respectively coupled to the positive power voltage and the negative power voltage. In an embodiment, the second amplifier includes a third PMOS transistor, a fourth PMOS transistor, a third NMOS transistor, a fourth NMOS transistor, a fifth switch, a sixth switch, a seventh switch, and an eighth switch. A drain of the third PMOS transistor is coupled to a gate of the fourth PMOS transistor through the fifth switch and coupled to the first terminal. A drain of the fourth PMOS transistor is coupled to a gate of the third PMOS transistor through the sixth switch and coupled to the fourth terminal. A source of the third PMOS transistor and a source of the fourth PMOS transistor are both coupled to the positive power voltage. A drain of the third NMOS transistor is coupled to a gate of the fourth NMOS transistor through the seventh switch and coupled to the first terminal. A drain of the fourth NMOS transistor is coupled to a gate of the third NMOS transistor through the eighth switch and coupled to the fourth terminal. A source of the third NMOS transistor and a source of the fourth NMOS transistor are both coupled to the negative power voltage. In the foregoing embodiment, the coupling transistors in the second amplifier have an effect of negative resistance compensation, and therefore, the oscillator circuit features low power consumption.

In an embodiment, for the first amplifier, a first impedance is formed between the first terminal and the fourth terminal, a second impedance is formed between the second terminal and the third terminal, an input voltage at the input of the first amplifier is greater than an output voltage determined by a voltage divider, and the voltage divider is constituted by the first impedance and the second impedance. In an embodiment, the input voltage exceeds a supply voltage of the first amplifier. In the foregoing possible implementation, a gain of the oscillator circuit can be increased.

In an embodiment, the tapped inductor includes two tapped segments, the two tapped segments are located at the second terminal and the fourth terminal respectively, and the two tapped segments are routed in the middle of the tapped inductor. In the foregoing embodiment, a change in positions of the two tapped segments may adjust power consumption, an output amplitude, and phase noise of the oscillator circuit, improving the performance of the oscillator circuit.

According to a second aspect, a non-transitory computer-readable medium used with a computer is provided. The computer has software used for creating an integrated circuit, one or more computer-readable data structures are stored on the computer-readable medium, and the one or more computer-readable data structures have photomask data used for manufacturing the oscillator circuit according to any one of the first aspect or the embodiments of the first aspect.

It may be understood that any non-transitory computer-readable medium used with a computer provided above includes the oscillator circuit provided above. Therefore, for beneficial effects that can be achieved by the non-transitory computer-readable medium used with a computer, refer to the beneficial effects of the oscillator circuit provided above. Details are not described herein again.

DESCRIPTION OF EMBODIMENTS

The construction and use of various embodiments are discussed in detail below. However, it should be understood that many applicable inventive concepts provided in this application can be implemented in a variety of specific environments. Though the specific embodiments discussed herein are merely illustrative of specific ways to implement and use this specification and the technologies, they do not limit the scope of this application.

Unless defined otherwise, all scientific and technical terms used herein have the same meaning as that well-known by a person of ordinary skill in the art.

Each circuit or another component may be described or claimed as "configured to" execute one or more tasks. In such contexts, "configured to" implicitly indicates a structure by indicating that the circuit/component includes a structure (for example, circuitry) that executes one or more tasks during operation. In this case, even when a specified circuit/component is not currently operational (for example, is not started), it can be said that the circuit/component is configured to perform the task. The circuit/component used with the phrase "configured to" includes hardware, for example, a circuit performing an operation. A statement that the circuit/component is "configured to" execute one or more tasks clearly indicates that 35 U.S.C. 112 (f) is not invoked.

In this specification, reference to "one embodiment", "an embodiment", "a specific embodiment", or "a particular embodiment" indicates that a particular feature, structure, or characteristic described with reference to a particular embodiment is included in at least one embodiment, but not necessarily in all particular embodiments. Therefore, a phrase "in a particular embodiment", "in an embodiment", or "in a specific embodiment" at different positions in this specification do not necessarily indicate a same embodiment. Furthermore, particular features, structures, or characteristics of any specific embodiment may be combined in any appropriate manner with one or more other particular embodiments. It is to be understood that other variations and modifications to the particular embodiments described and illustrated herein are possible in light of the teachings herein and are to be considered as part of the scope of this application.

Figure 1:
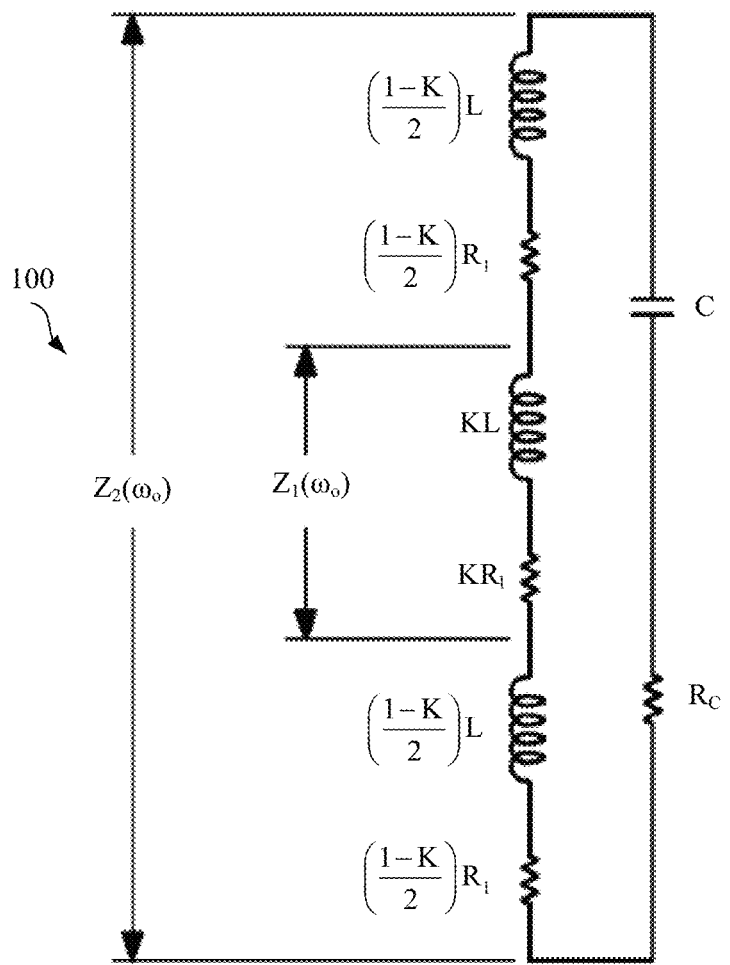
FIG. 1 is a schematic diagram of a differential LC tank according to an embodiment of this application.

FIG. 1 is a schematic diagram of an LC tank 100 including parasitic resistors $R_c$ and $R_l$. The LC tank 100 is used in a differential voltage controlled oscillator (VCO), and may also be referred to as an LC resonant circuit, an LC resonator, a resonator, or the like. An amplifier in a VCO provides a current for an input impedance of the LC tank 100. A voltage that is generated by the LC tank 100 and that passes through the LC circuit is equal to a voltage at an input of the amplifier. In a conventional single-inductor VCO (for example, Pierce configuration), an amplifier drives an impedance at $Z_2(\omega_o)$, and a voltage at an input of the amplifier is expressed as a voltage passing through $Z_2(\omega_o)$.

In this application, the single inductor is tapped (for example, divided into at least two parts) based on a coefficient K. The amplifier drives an inductor tap defined by an impedance at $Z_1(\omega_o)$, and the voltage at the input of the amplifier is from a signal that passes through an inductor tap defined by the impedance at $Z_2(\omega_o)$. Theoretically, inductor segments KL and (1−K)/2*L can be viewed as separate inductors because of small inductances and very high frequencies. However, separate inductors are impractical due to physical size requirements and mutual coupling.

Because the input and an output of the amplifier are located at different points (that is, $Z_2$ and $Z_1$) in the LC tank 100, an input voltage of the amplifier in the VCO may be far greater than an output voltage of the amplifier that is determined, through measurement, by a voltage divider of a tapped inductor. There are a number of advantages to this arrangement.

A hot carrier injection (HCI) voltage limit of the amplifier is limited only to the output. HCI is a phenomenon in which charge carriers are trapped in a dielectric of a gate of a MOS transistor and permanently alter a switching characteristic of the MOS transistor. This allows the input signal to exceed a supply voltage restriction of the amplifier. The input voltage represents energy stored in the LC tank 100. Therefore, when total inductances are the same, the VCO has lower noise when being compared with a VCO with a conventional resonator. This is because a voltage of the LC tank 100 is high. In addition, the inductor can meet a requirement for noise with its size not reduced. In this case, the inductor has a high Q value when being integrated into an integrated circuit (for example, as a part of an ASIC).

Because the input voltage to the amplifier exceeds that of a power supply rail, the gain of the amplifier is higher for given power consumption. An output current of the amplifier is a product of an input voltage passing through $Z_2$ and transconductance $g_m$ of the amplifier. Because the input voltage increases, the amplifier has a larger gain when the current remains the same. This reduces a requirement for a power of a system.

It can be learned from FIG. 1 and the following equations (1) to (5) that, in the LC circuit 100, the impedance at $Z_1(\omega_o)$ is less than the impedance at $Z_2(\omega_o)$ by one factor $K^2$. The linearity of the amplifier under large signal conditions is dominated by the linearity at its output rather than its input. Because of a low impedance at an output of the VCO, nonlinear mixing of flicker noise and a VCO frequency is reduced, improving utilization of a sideband noise spectrum near the output of the VCO. A person skilled in the art understands that flicker noise at a baseband frequency is electronic noise that has a 1/ω density spectrum but is mixed by a nonlinear element, and generates a $1/\omega^3$ portion of single-sideband phase noise of the VCO.

$$\text{Resonance value } \omega_o^2 = \frac{1}{LC}, \text{ and } \omega_o L = X_o \quad (1)$$

$$\text{Re}\{Z_1(\omega_o)\} = \frac{KR_l[(1-K)R_l + R_c]}{R_l + R_c} + \frac{(K\omega_o L)^2}{R_l + R_c} \quad (2)$$

$$\text{Re}\{Z_1((\omega_o)\} \approx K^2 \left[\frac{X_0^2}{R_l + R_c}\right] \quad (3)$$

$$\text{Re}\{Z_2(\omega_o)\} = \frac{R_l R_c}{R_l + R_c} + \frac{(\omega_o L)^2}{R_l + R_c} \quad (4)$$

$$\text{Re}\{Z_2((\omega_o)\} \approx \left[\frac{X_0^2}{R_l + R_c}\right] \quad (5)$$

In the foregoing equations, $\omega_o$ represents an oscillation frequency (radians/second);

L represents the inductance;

C represents the capacitance;

$R_l$ represents a parasitic resistance of an inductor;

$R_c$ represents a parasitic resistance of a capacitor;

K represents a constant associating $Z_1$ with $Z_2$; and $X_o$ represents a reactance of an inductor L at a resonance frequency of $\omega_o$.

Figure 2:
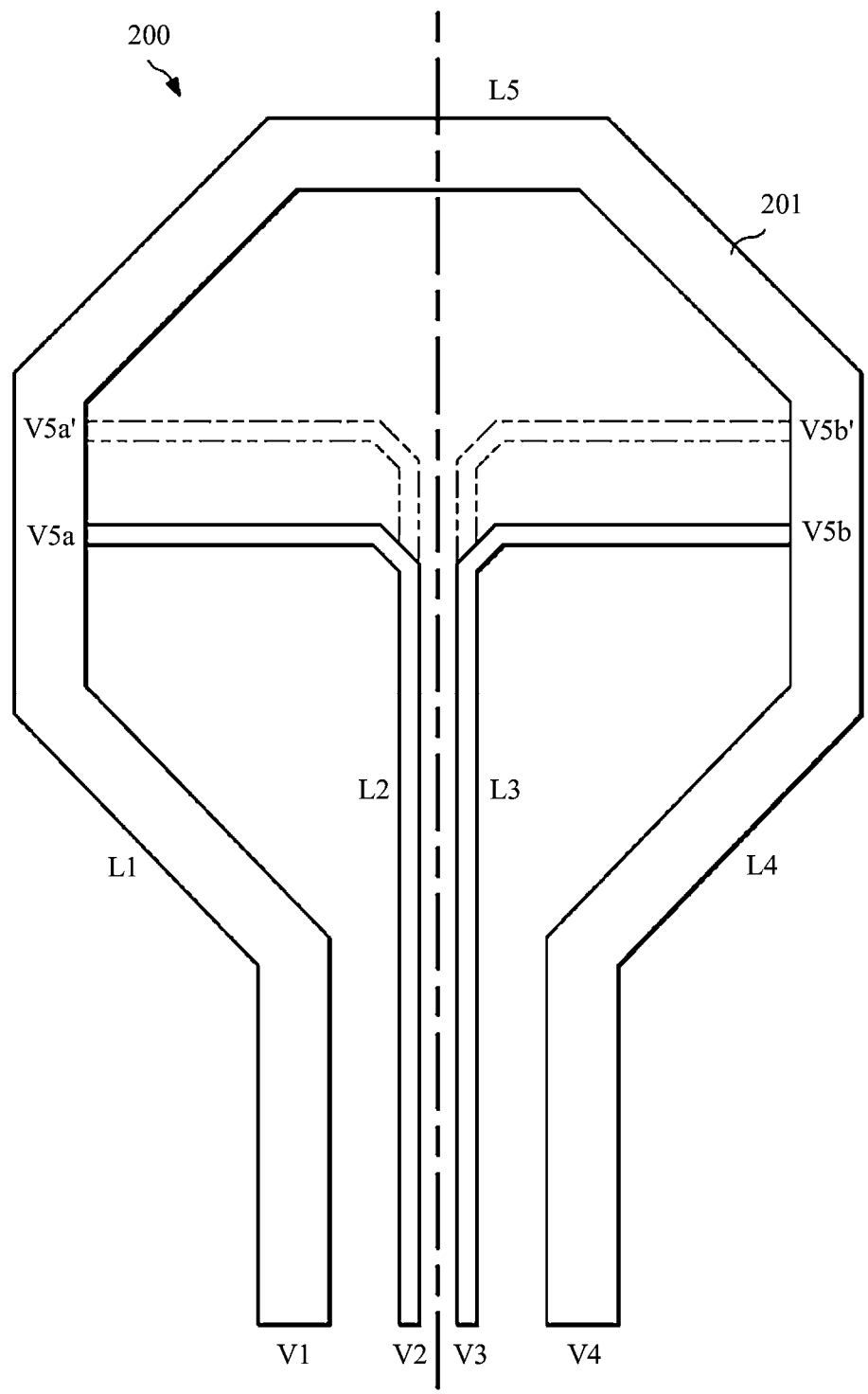
FIG. 2 is an example layout of a differential tapped inductor according to an embodiment of this application.
Figure 3:
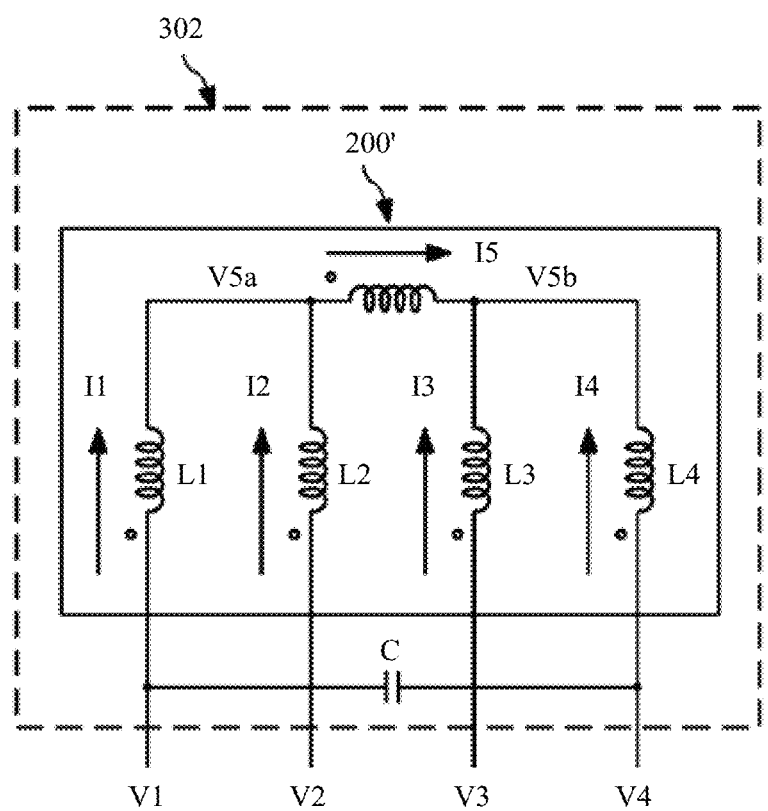
FIG. 3 is a schematic diagram of a differential tapped LC tank according to an embodiment of this application.

FIG. 2 shows an example layout of a differential tapped inductor 200 that is used in an LC tank (for example, the LC tank 100 shown in FIG. 1) and is configured to be integrated into an integrated circuit in accordance with principles in this application. FIG. 3 is an ideal schematic diagram of a differential tapped LC tank 302, including representation of an equivalent inductor 200' of the tapped inductor 200 in FIG. 2 coupled in parallel to a capacitor C. It should be noted that the segments V1-V5a, V2-V5a, V3-V5b, V4-V5b, and V5a-V5b in FIG. 2 correspond to inductors L1, L2, L3, L4, and L5 in the schematic diagram of FIG. 3, respectively.

The differential tapped inductor 200 includes one or more conductive segments (for example, V1-V5a, V4-V5b, and V5a-V5b) that constitute a physical loop 201. The term "physical loop" used in this specification indicates a closed or nearly closed geometric shape. The shape has a starting point and an ending point that are co-located or immediately adjacent to each other, and includes at least one distinct convex portion. The convex portion defines an interior space (for example, an annular polygon or an annular polygon segment) within the convex portion. Therefore, the physical loop is different from an "electrical loop". The electrical loop usually indicates a closed path of any shape through which a current may flow.

The physical loop 201 is symmetrical, and is shown as being roughly octagonal when being in the inductor 200. A person skilled in the art understands that without departing from the scope of this application, the physical loop 201 may include other symmetrical and asymmetrical shapes (for example, a rectangle, a square, or a hexagon). The inductor 200 is tapped with segments V2-V5a and V3-V5b via an electrical connection apparatus at V5a and V5b, to form electrical loops (L2 and L3) disposed within the interior space including the physical loop 21 (including L1, L5, and L4).

A capacitive element C in the differential tapped LC tank 302 may be embodied as a PMOS varactor, an NMOS varactor, a metal-insulator-metal (MIM) device, or any other appropriate capacitive element. In a silicon process, two types of varactors may be used: a reversed-bias pn junction diode or a MOS capacitor varactor. The MOS capacitor varactor may include a MOS transistor. A drain, source, and body connector of the MOS transistor are coupled together, and a capacitance is adjusted based on a voltage applied between a body and a gate connector. A person skilled in the art understands that without departing from the scope of this application, another substitute for the capacitive element C in the LC tank 302 may be used.

A quality factor (quality factor, Q) of the differential tapped LC tank 302 depends on the inductor 200 with a low resistance. The resistance of the inductor 200 is minimized by using a thick/wide metallization process such as, but not limited to, aluminum, copper, gold, or another appropriate material to reduce a series resistance. The inductor 200 preferably includes a high dielectric substrate material such as silicon, gallium arsenide, or another appropriate material. Surface micro-machining technologies may be used to create an air gap between the inductor and a substrate to further increase dielectric properties.

The tapped segments V2-V5a and V3-V5b (L2 and L3) of the inductor 200 are coupled to the output of the amplifier and do not belong to the LC resonant circuit. Accordingly, their parasitic resistances are not as critical as parasitic resistances of inductor segments of L1, L4, and L5. Thus, segments L2 and L3 may be constructed using a thin metal material as depicted in FIG. 2.

A practical problem existing when a plurality of inductors (for example, L1 to L5) are used is about a mutual inductance in any connection from the amplifier output to tapped points V5a and V5b. The inductor current in the resonant LC circuit is typically much higher than the current supplied from the amplifier by a circuit factor Q. When the mutual inductance is high, an induced current from the resonant LC circuit becomes high enough in a lead from the output of the amplifier to a tapped point such that an input impedance to the tap becomes so high that the amplifier cannot supply any current. To resolve the problem, the tapped segments V2-V5a (L2) and V3-V5b (L3) are directed upwards in the middle of the inductor 200 (as shown in FIG. 2). In this case, induced currents from symmetrical halves of the inductor 200 cancel each other out.

Tapped positions V5a and V5b may be adjusted on the metal to change power consumption, a VCO output swing, and phase noise performance. This may be used to fine-tune design on a metal side, as shown by V5a' and V5b'. The substrate may be doped with an additive to have a high resistivity, and/or a distance between a metal layer and the substrate may be increased through etching or micro-machining, to minimize parasitic effects of the substrate.

Figure 4:
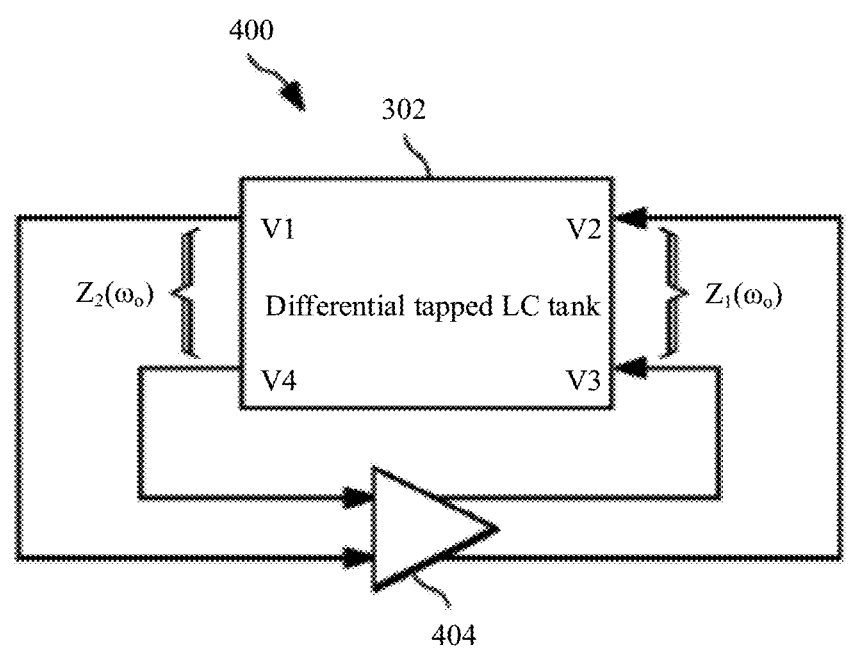
FIG. 4 is a block diagram of a differential VCO according to an embodiment of this application.

FIG. 4 is a block diagram of a differential VCO 400 implemented in accordance with principles in this application. A differential tapped LC tank 302 (shown in detail in FIG. 3) has terminals V1, V2, V3, and V4. The terminals V1 and V4 are coupled to an input of an amplifier 404, and the terminals V2 and V3 are coupled to an output of the amplifier 404. The amplifier 404 preferably has a CMOS topology. However, a person skilled in the art understands that without departing from the scope of this application, another appropriate amplifier topology may be used, for example, PMOS, NMOS, or dipole.

Figure 5:
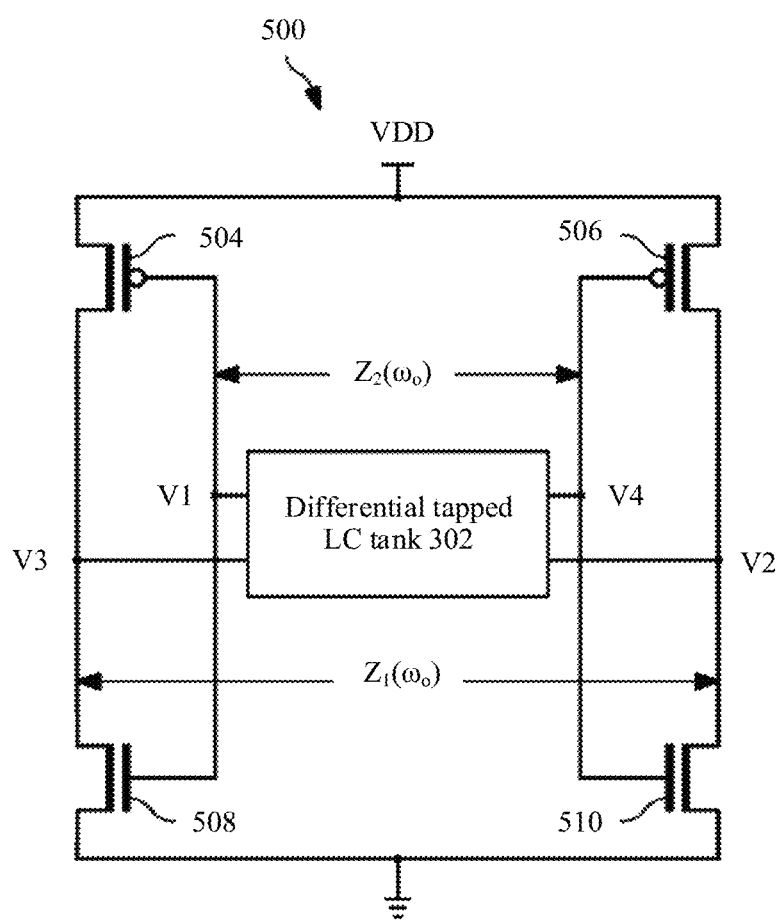
FIG. 5 is a schematic diagram of a first differential VCO according to an embodiment of this application.

FIG. 5 is a schematic diagram of an example differential CMOS VCO 500 using a differential tapped LC tank 302 that is implemented in accordance with principles in this application. A CMOS amplifier includes PMOS transistors 504 and 506 and NMOS transistors 508 and 510. Sources of the PMOS transistors 504 and 506 are coupled to a positive power voltage (VDD), and gates of the PMOS transistors 504 and 506 are coupled to gates of the NMOS transistors 508 and 510. The gates of the PMOS transistor 504 and the NMOS transistor 508 are coupled to a tap V1 of the differential tapped LC tank 302. The gates of the PMOS transistor 506 and the NMOS transistor 510 are coupled to a tap V4 of the differential tapped LC tank 302. Sources of the NMOS transistors 508 and 510 are coupled to a negative power voltage (ground), and drains of the NMOS transistors 508 and 510 are coupled to drains of the PMOS transistors 504 and 506.

Taps V2 and V3 of the differential LC energy storage resonator circuit 302 are coupled to the usually coupled drains of the PMOS transistor 504 and the NMOS transistor 508 and the usually coupled drains of the PMOS transistor 506 and the NMOS transistor 510, respectively.

Figure 6:
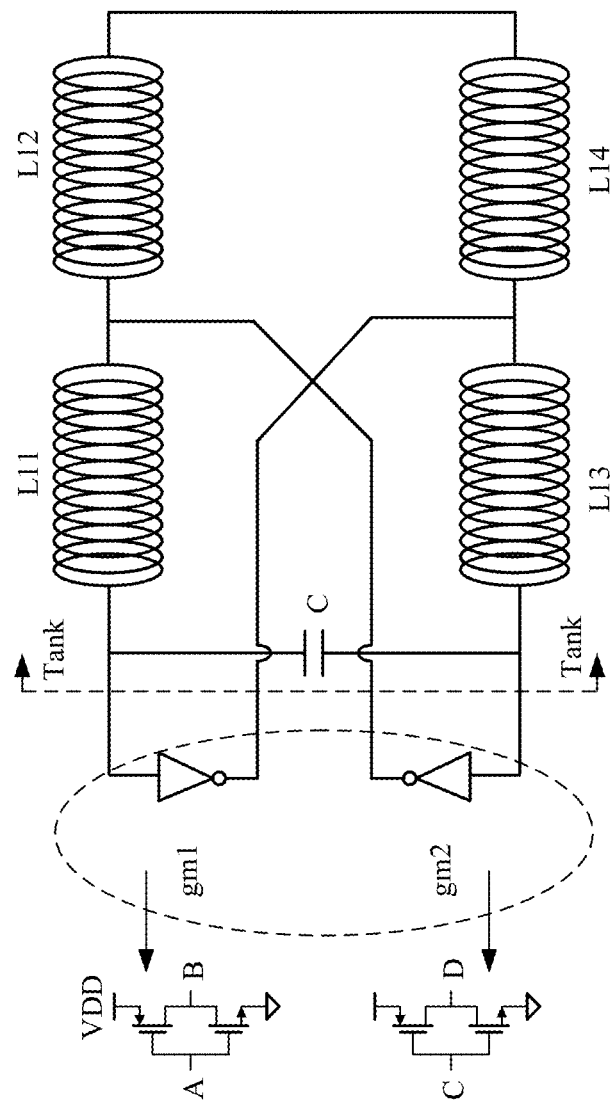
FIG. 6 is a schematic diagram of a second differential VCO according to an embodiment of this application.

FIG. 6 is a schematic diagram of a circuit of a differential CMOS VCO 500 implemented in accordance with principles in this application. A first amplifier transistor pair gm1 in FIG. 6 corresponds to the PMOS transistor 504 and the NMOS transistor 508 in FIG. 5, and a second amplifier transistor pair gm2 in FIG. 6 corresponds to the PMOS transistor 506 and the NMOS transistor 510 in FIG. 5. It should be noted that in actual application, equivalent inductors L1 to L5 in the differential tapped LC tank 302 may be designed with reference to inductors L11 to L14 shown in FIG. 6. L11 to L14 are merely examples and do not constitute a limitation on embodiments of this application.

In FIG. 6, L11 to L14 and a capacitor C are connected in parallel to form a tank of an oscillator. PMOS transistors and NMOS transistors in a CMOS amplifier form a negative resistance by crossing positive feedbacks, to offset a loss of the tank and form an oscillator that is in class AB mode. For the PMOS transistor 504 and the NMOS transistor 508, amplitudes of alternating current signals seen at a gate A and a drain B are different. This is because an impedance seen at a terminal B is less than an impedance seen at a terminal A. A ratio of the impedance seen at the terminal B to the impedance seen at the terminal A is approximately (L14+L11+L12)/(L11+L12+L13+L14) according to small signal linear analysis. Therefore, when different L3-to-L4 ratios are selected to change the impedance seen at the drain B of the first amplifier transistor pair gm1, the first amplifier transistor pair gm1 can operate in a linear region of the class AB mode. Compared with a conventional CMOS oscillator, the class AB oscillator constituted by inductive feedbacks shown in FIG. 6 has a larger oscillation amplitude at the gate, reducing nonlinearity at the drain and having better phase noise.

Figure 7:
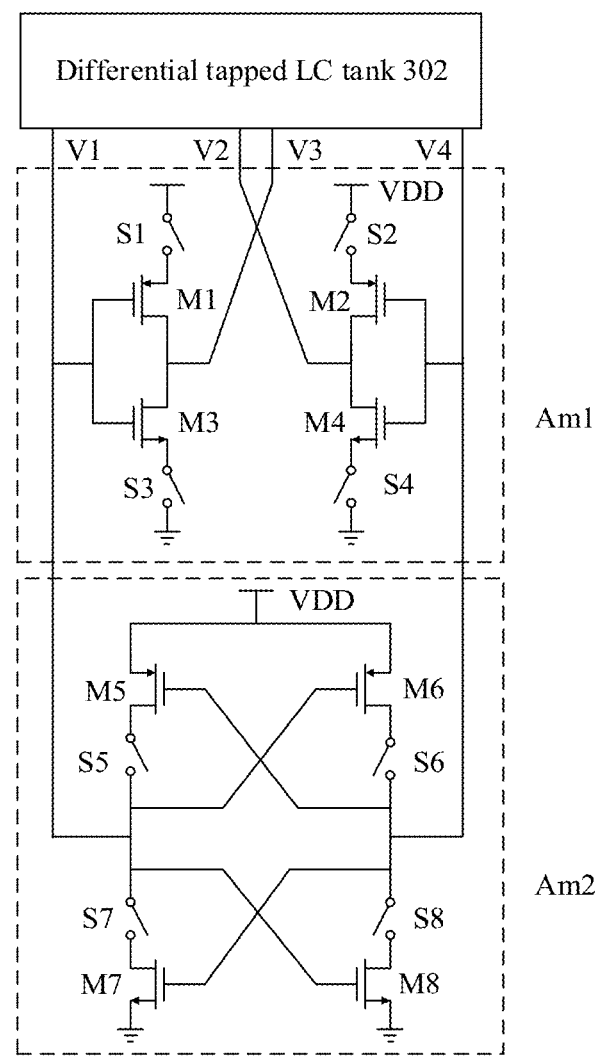
FIG. 7 is a schematic diagram of a third differential VCO according to an embodiment of this application.

Currently, a communication device is usually configured to run a plurality of different types of services. Different types of services usually have different requirements for oscillator performance such as power consumption and noise. For example, a voice call service usually requires that an oscillator should have low noise; in this case, power consumption of the oscillator is high; and an Internet access service has a lower requirement for noise than the voice call service, and therefore, power consumption of a required oscillator is also low. The differential CMOS VCO provided above may be applied to a low-noise, high-power scenario, but there is a waste of power when the differential CMOS VCO is used in a low-power scenario. Based on this, the following provides an amplifier-switchable VCO, configured to meet different requirements for power consumption and noise in different scenarios. Details are provided as follows:

FIG. 7 is a schematic diagram of a circuit of an example VCO 700 using a differential tapped LC tank 302 that is implemented in accordance with principles in this application. Amplifiers in the VCO 700 include a first amplifier Am1 with differential inputs and differential outputs and a second amplifier Am2 with differential outputs. The first amplifier Am1 and the second amplifier Am2 can be switched by using switches, and the oscillator circuit can operate in an inductive feedback mode (which may also be referred to as a class AB mode) or a negative resistance mode through switching.

Signals at the differential inputs and the differential outputs are differential signals with a phase difference of 180 degrees. In the inductive feedback mode, differential inputs and differential outputs of an amplifier in the VCO are both coupled to a tapped inductor, and a change in an output voltage of the amplifier causes a change in an input voltage of the amplifier. In the negative resistance mode, an amplifier in the VCO uses an architecture in which a CMOS transistor pair is cross-coupled. Therefore, the amplifier is a two-terminal device, with only outputs, so only differential outputs of the amplifier are coupled to a tapped inductor.

In the oscillator circuit provided in this embodiment of this application, when operating in the inductive feedback mode in FIG. 7, the oscillator circuit features low noise, and when operating in the negative resistance mode in FIG. 7, the oscillator circuit features low power consumption. In this way, requirements for noise and power consumption in different scenarios are met, improving performance of the oscillator circuit.

In an embodiment, the first amplifier Am1 may include the following three different structures. The following separately describes the three structures in detail.

A first structure is described as follows: The first amplifier Am1 includes two groups of first coupling transistors with gates coupled together and drains coupled together, and sources of the two groups of first coupling transistors are respectively coupled to a positive power voltage (VDD) and a negative power voltage (reference ground) through switches. In an embodiment, as shown in FIG. 7, the first amplifier Am1 includes a first PMOS transistor M1, a second PMOS transistor M2, a first NMOS transistor M3, a second NMOS transistor M4, a first switch S1, a second switch S2, a third switch S3, and a fourth switch S4. A gate of the first PMOS transistor M1 and a gate of the first NMOS transistor M3 are both coupled to a first terminal V1. A drain of the first PMOS transistor M1 and a drain of the first NMOS transistor M3 are both coupled to a third terminal V3. A gate of the second PMOS transistor M2 and a gate of the second NMOS transistor M4 are both coupled to a fourth terminal V4. A drain of the second PMOS transistor M2 and a drain of the second NMOS transistor M4 are both coupled to a second terminal V2. A source of the first PMOS transistor M1 and a source of the second PMOS transistor M2 are coupled to the positive power voltage (VDD) through the first switch S1 and the second switch S2, respectively. A source of the first NMOS transistor M3 and a source of the second NMOS transistor M4 are coupled to the negative power voltage (reference ground) through the third switch S3 and the fourth switch S4, respectively. It should be noted that the first switch S1 and the second switch S2 may be alternatively replaced with one switch, and the sources of the first PMOS transistor M1 and the second PMOS transistor M2 multiplex the switch; and likewise, the third switch S3 and the fourth switch S4 may be alternatively replaced with one switch, and the sources of the first NMOS transistor M3 and the second NMOS transistor M4 multiplex the switch.

Figure 8A:
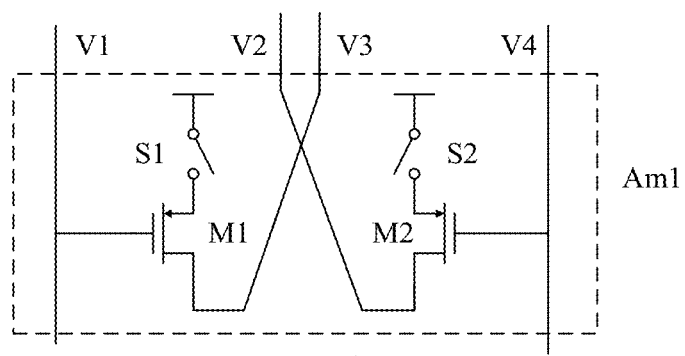
FIG. 8(a) and FIG. 8(b) are schematic diagrams of a first amplifier according to an embodiment of this application.

A second structure is described as follows: As shown in FIG. 8(a), the first amplifier Am1 includes a first PMOS transistor M1, a second PMOS transistor M2, a first switch S1, and a second switch S2. A gate of the first PMOS transistor M1 is coupled to a first terminal V1. A drain of the first PMOS transistor M1 is coupled to a third terminal V3. A drain of the second PMOS transistor M2 is coupled to a second terminal V2. A gate of the second PMOS transistor M2 is coupled to a fourth terminal V4. A source of the first PMOS transistor M1 and a source of the second PMOS transistor M2 are coupled to a positive power voltage (VDD) through the first switch S1 and the second switch S2, respectively. It should be noted that the first switch S1 and the second switch S2 may be alternatively replaced with one switch, and the sources of the first PMOS transistor M1 and the second PMOS transistor M2 multiplex the switch.

Figure 8B:
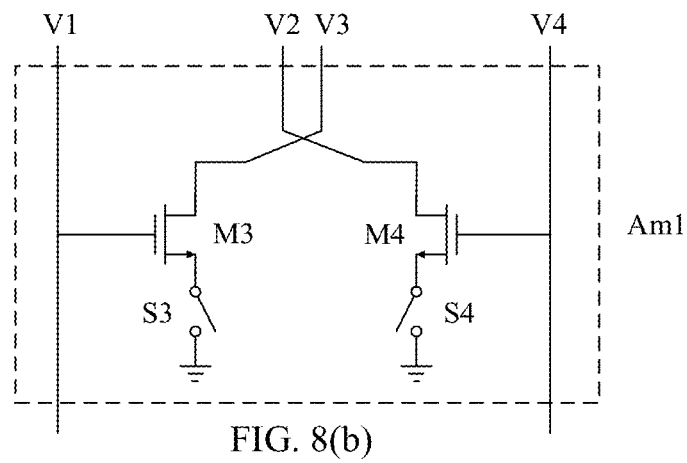

A third structure is described as follows: As shown in FIG. 8(b), the first amplifier Am1 includes a first NMOS transistor M3, a second NMOS transistor M4, a third switch S3, and a fourth switch S4. A gate of the first NMOS transistor M3 is coupled to a first terminal V1. A drain of the first NMOS transistor M3 is coupled to a third terminal V3. A drain of the second NMOS transistor M4 is coupled to a second terminal V2. A gate of the second NMOS transistor M4 is coupled to a fourth terminal V4. A source of the first NMOS transistor M3 and a source of the second NMOS transistor M4 are coupled to a negative power voltage (reference ground) through the third switch S3 and the fourth switch S4, respectively. It should be noted that the third switch S3 and the fourth switch S4 may be alternatively replaced with one switch, and the sources of the first NMOS transistor M3 and the second NMOS transistor M4 multiplex the switch.

The second and third structures are both single-ended structures, and have higher power consumptions but better noise performance compared with the first structure.

In an embodiment, the second amplifier Am2 may also include the following three different structures. The following separately describes the three structures in detail.

A first structure is described as follows: The second amplifier Am2 is configured to enable the oscillator circuit to operate in a complementary negative resistance mode. The second amplifier Am2 includes two groups of second coupling transistors with gates and drains cross-coupled, the drains are coupled by using switches, and sources of the two groups of second coupling transistors are respectively coupled to the positive power voltage (VDD) and the negative power voltage (reference ground). In an embodiment, as shown in FIG. 7, the second amplifier Am2 includes a third PMOS transistor M5, a fourth PMOS transistor M6, a third NMOS transistor M7, a fourth NMOS transistor M8, a fifth switch S5, a sixth switch S6, a seventh switch S7, and an eighth switch S8. A drain of the third PMOS transistor M5 is coupled to a gate of the fourth PMOS transistor M6 through the fifth switch S5 and coupled to the first terminal V1. A drain of the fourth PMOS transistor M6 is coupled to a gate of the third PMOS transistor M5 through the sixth switch S6 and coupled to the fourth terminal V4. A source of the third PMOS transistor M5 and a source of the fourth PMOS transistor M6 are both coupled to the positive power voltage (VDD). A drain of the third PMOS transistor M7 is coupled to a gate of the fourth PMOS transistor M8 through the seventh switch S7 and coupled to the first terminal V1. A drain of the fourth PMOS transistor M8 is coupled to a gate of the third PMOS transistor M7 through the eighth switch S8 and coupled to the fourth terminal V4. A source of the third PMOS transistor M7 and a source of the fourth PMOS transistor M8 are both coupled to the negative power voltage (reference ground).

Figure 9A:
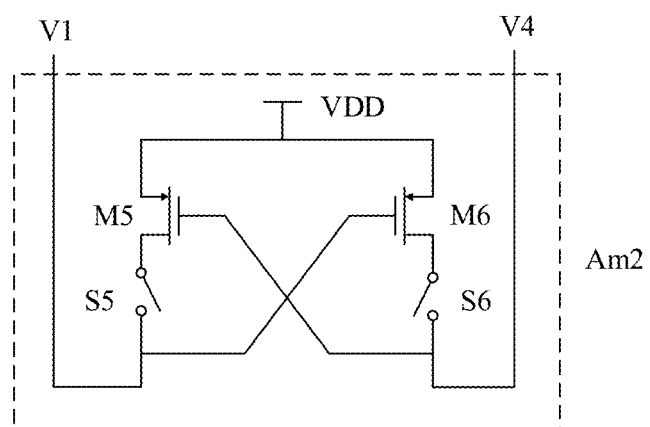
FIG. 9(a) and FIG. 9(b) are schematic diagrams of a second amplifier according to an embodiment of this application.

A second structure is described as follows: The second amplifier is configured to enable the oscillator circuit to operate in a single-ended negative resistance mode. As shown in FIG. 9(a), the second amplifier Am2 includes a third PMOS transistor M5, a fourth PMOS transistor M6, a fifth switch S5, and a sixth switch S6. A drain of the third PMOS transistor M5 is coupled to a gate of the fourth PMOS transistor M6 through the fifth switch S5 and coupled to the first terminal V1. A drain of the fourth PMOS transistor M6 is coupled to a gate of the third PMOS transistor M5 through the sixth switch S6 and coupled to the fourth terminal V4. A source of the third PMOS transistor M5 and a source of the fourth PMOS transistor M6 are both coupled to the positive power voltage (VDD).

Figure 9B:
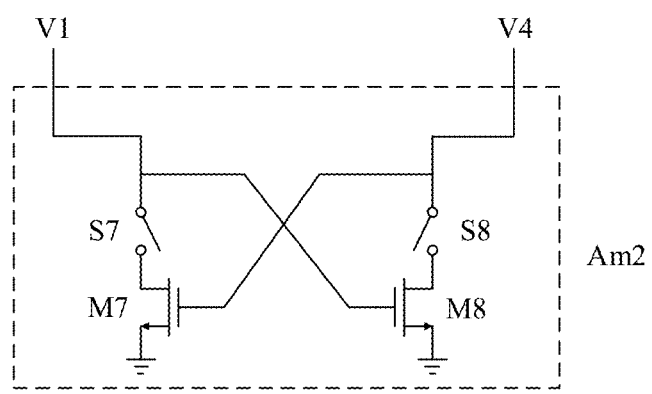

A third structure is described as follows: The second amplifier is configured to enable the oscillator circuit to operate in the single-ended negative resistance mode. As shown in FIG. 9(b), the second amplifier Am2 includes a third NMOS transistor M7, a fourth NMOS transistor M8, a seventh switch S7, and an eighth switch S8. A drain of the third NMOS transistor M7 is coupled to a gate of the fourth NMOS transistor M8 through the seventh switch S7 and coupled to the first terminal V1. A drain of the fourth NMOS transistor M8 is coupled to a gate of the third NMOS transistor M7 through the eighth switch S8 and coupled to the fourth terminal V4. A source of the third NMOS transistor M7 and a source of the fourth NMOS transistor M8 are both coupled to the negative power voltage (reference ground).

Similarly, the second and third structures are also single-ended architectures, and have better noise performance but higher power consumptions compared with the first structure.

In an embodiment, the oscillator circuit shown in FIG. 7 is used as an example to describe switching states of the first amplifier Am1 and the second amplifier Am2 in the oscillator. When the first switch S1 to the fourth switch S4 are turned on and the fifth switch S5 to the eighth switch S8 are turned off, the first amplifier Am1 is in an operating state, and an operating mode of the oscillator circuit is switched to the inductive feedback mode. In this case, the oscillator circuit features low noise. This mode is applicable to a scenario with a high requirement for noise, for example, a voice call service. When the first switch S1 to the fourth switch S4 are turned off and the fifth switch S5 to the eighth switch S8 are turned on, the second amplifier Am2 is in an operating state, and an operating mode of the oscillator circuit is switched to the negative resistance mode. In this case, the oscillator circuit features low power consumption. This mode is applicable to a scenario with a high requirement for noise performance, for example, an Internet access service. Therefore, the oscillator circuit may meet different requirements for power consumption and noise in different scenarios. When the oscillator circuit includes the first amplifier provided in FIG. 8(a) and FIG. 8(b) or the second amplifier provided in FIG. 9(a) and FIG. 9(b), a specific switching process is similar to the foregoing switching process. Details are not described herein again in this embodiment of this application.

When the oscillator circuit operates in different modes and different structures, the oscillator has different power consumptions and different noise performance, meeting requirements in different application scenarios. A power consumed when the oscillator circuit operates in a single-ended mode is greater than a power consumed when the oscillator circuit operates in a complementary mode, and a power consumed when the oscillator circuit operates in the inductive feedback mode is greater than a power consumed when the oscillator circuit operates in the negative resistance mode. However, noise performance improves accordingly along with an increase in power consumption.

It should be noted that specific structures of the first amplifiers Am1 and the second amplifiers Am2 shown in FIG. 7 to FIG. 9(b) are merely examples, and in actual application, the first amplifier Am1 and the second amplifier Am2 may be alternatively amplifiers with same functions but other topologies, for example, PMOS, NMOS, and dipole. Details are not described herein again in this embodiment of this application.

Modern integrated circuit design and manufacturing are commonly automated using electronic design automation (EDA) tools. Example tools may be found from companies such as, but not limited to, Synopsys, Cadence, and Mentor Graphics. Details of these EDA tools are not described in this application.

Figure 10:
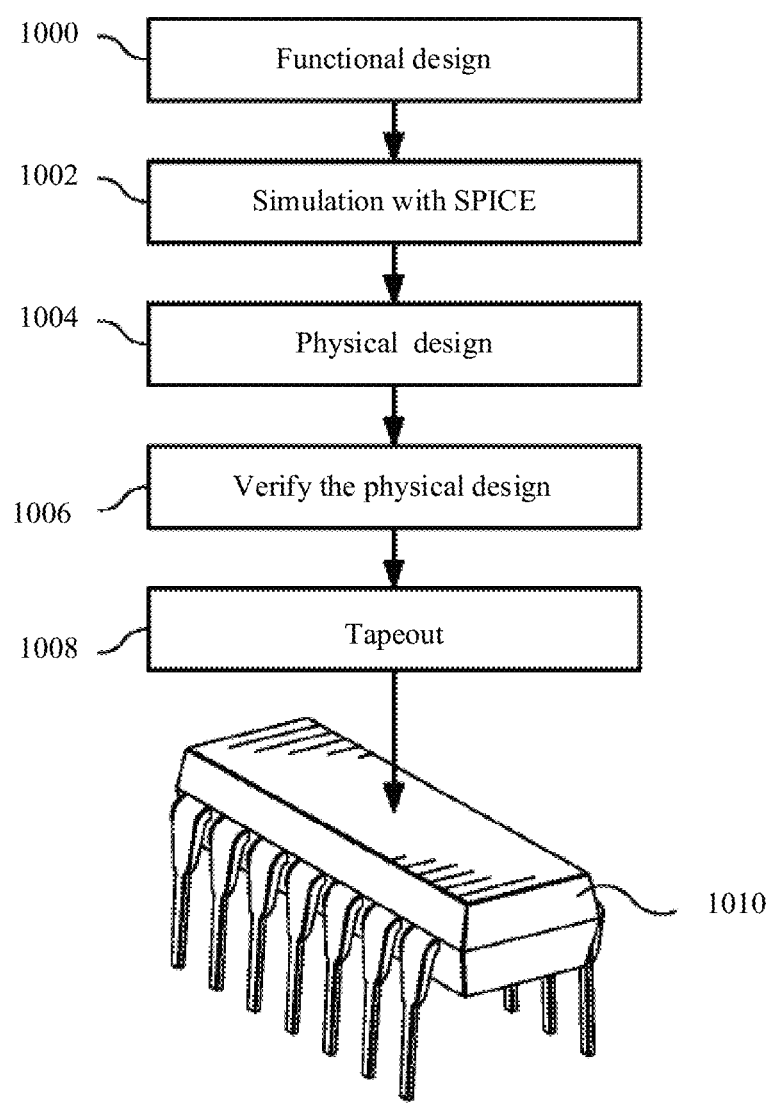
FIG. 10 is a flowchart of designing an ASIC according to an embodiment of this application.

FIG. 10 is a flowchart of designing, by using EDA tools, a simplified general-purpose ASIC with a VCO that is implemented in accordance with principles in this application. At block 1000, functional design of an ASIC that may include a VCO is created. The VCO has a tapped inductor 200 that is implemented in accordance with principles in this application.

For those ASICs, digital functional design is typically manifested by compiling register transfer level (RTL) code in a hardware descriptive language (HDL) such as but not limited to, VHDL or Verilog. Functional verification (behavioral simulation) is then preferably performed on an HDL data structure to ensure that the RTL design is in accordance with logic specifications. Alternatively, a schematic diagram of digital logic can be captured by using a schematic diagram capture program.

For some ASICs that are simulated actually (such as a VCO with a tapped inductor in this application), analog functional design is usually manifested by capturing a schematic diagram by using a schematic diagram capture program. Outputs of the schematic diagram capture program are then converted (combined) into a data structure of a gate/transistor level netlist.

At block 1002, the data structure is simulated by using a simulation program with integrated circuits emphasis (SPICE). At block 1004, the data structure obtained from block 1002 is instantiated by using a geometric representation of the data structure, and a physical layout of the ASIC is performed.

A first step in the physical layout is usually what is called "layout planning". In the step, a total area on an integrated circuit chip is allocated, and input/output (I/O) pins are defined. Hard cores (such as an array, an analog block, and an inductor) are placed within the gross regions based on design constraints (such as a trace length and timing). Clocks are placed (commonly referred to as a clock tree), and connections between gates/analog blocks are routed.

When all the elements are placed, all the elements are connected together through global and detailed wiring. Postwiring optimization is preferably performed to improve performance (timing closure), noise (signal integrity), and yield. The layout is modified, where possible, while maintaining compliance with the design rules set by the captive or external semiconductor manufacturing foundry of choice, to make it more efficient to produce. Such modifications may include adding extra vias or dummy metal/diffusion/poly layers.

At block 1006, physical design is verified. Design rule checking (DRC) is performed to determine whether the physical layout of ASICs satisfies a series of recommended parameters, that is, design rules of the foundry. The design rules are a series of parameters provided by the foundry that are specific to a particular semiconductor manufacturing process. The design rules specify certain geometric and connectivity restrictions to ensure sufficient margins to account for variability in semiconductor manufacturing processes, to ensure that the ASICs work normally. A layout versus schematic (LVS) check is preferably performed to verify that the physical layout corresponds to an original schematic or circuit diagram of the design. Complete simulation is then preferably performed to ensure the layout phase is appropriately completed.

After the layout is verified in block 1006, mask generation design data usually manifested in a form of a GDSII data structure is referred to as "tape out" for producing photomasks at block 1008. The GDSII data structures are transferred through a communication medium (for example, a memory or network) from a circuit designer to either a photomask supplier/manufacturer or directly to a semiconductor foundry.

At block 1010, photomasks are created, and the ASIC is manufactured in accordance with principles in this application by using the photomasks.

Some of the technologies described in this specification may be implemented by software stored on one or more computer-readable storage media and executed on a computer. The selected technologies may be executed on a single computer or a computer networked with another computer or computers. For clarity, only those aspects of tools or computer germane to the disclosed technologies are described. Product details well known in the art may be omitted.

Figure 11:
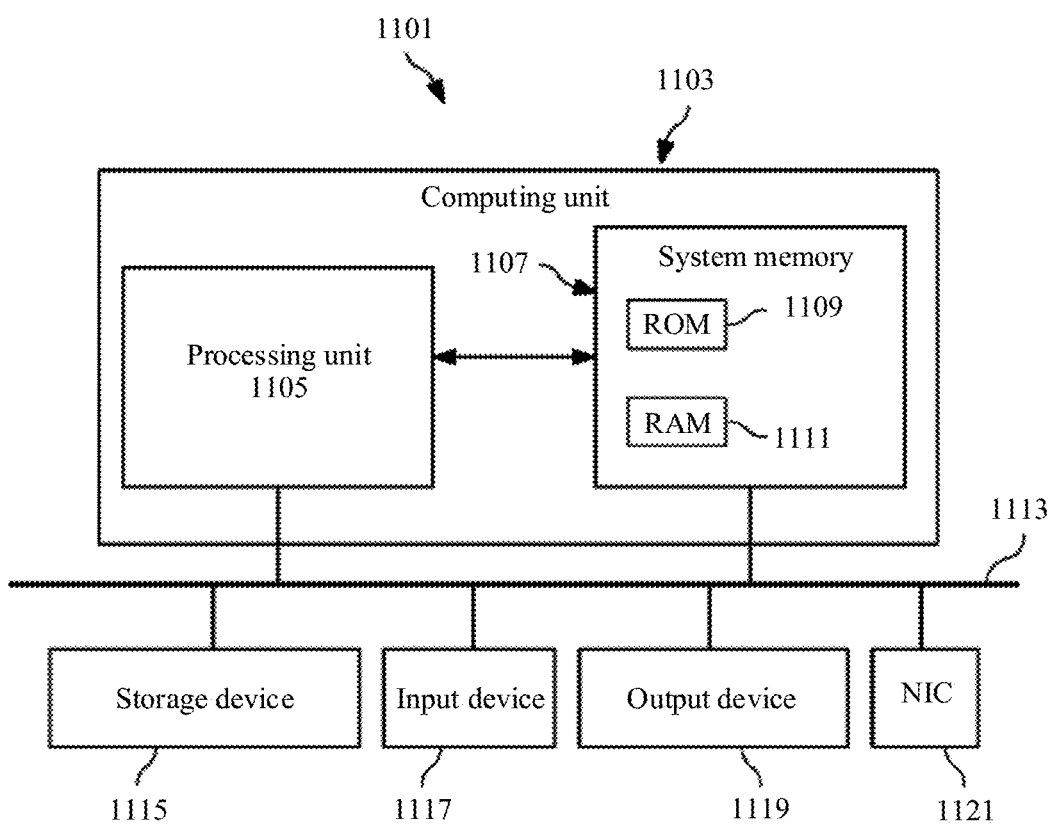
FIG. 11 is an illustrative example of a computing device according to an embodiment of this application.

FIG. 11 shows an illustrative example of a computing device 1101 for practicing the design process of FIG. 11. As shown in FIG. 11, the computing device 1101 includes a computing unit 1103 having a processing unit 1105 and a system memory 1107. The processing unit 1105 may be any type of programmable electronic device for executing software instructions, but is usually a microprocessor. The system memory 1107 may include both a read-only memory (ROM) 1109 and a random access memory (RAM) 1111. It should be understood by a person of ordinary skill in the art that both the read-only memory 1109 and the random access memory 1111 may store software instructions executed by the processing unit 1105.

The processing unit 1105 and the system memory 1107 are connected to one or more peripheral devices either directly or indirectly through a bus 1113 or an alternate communication structure. For example, the processing unit 1105 or the system memory 1107 may be directly or indirectly connected to one or more additional memory storage devices 1115. The storage device 1115 may include a "hard" disk drive, a solid-state disk drive, an optical disk drive, a removable disk drive, and the like. The processing unit 1105 and the system memory 1107 may also be directly or indirectly connected to one or more input devices 1117 and one or more output devices 1119. The input devices 1117 may include, for example, a keyboard, a pointing device (such as a mouse, touchpad, stylus, trackball, or joystick), a scanner, a camera, and a microphone. The output devices 1119 may include, for example, a display device, a printer, and a speaker. For various examples of the computing device 1101, a computing unit 1103 may be disposed inside one or more of the peripheral devices 1115 to 1119. Alternately, one or more of the peripheral devices 1115 to 1119 may be outside a housing of the computing unit 1103 and connected to the bus 1113 through, for example, a universal serial bus (USB) connector or a digital visual interface (DVI) connector.

In some embodiments, the computing unit 1103 may also be directly or indirectly connected to one or more network interface cards (NIC) 1121, for communicating with other devices constituting a network. The network interface cards 1121 translate data and control signals from the computing unit 1103 into network messages according to one or more communication protocols, such as the transmission control protocol (TCP) and the internet protocol (IP). In addition, the network interface cards 1121 may use any appropriate connection agent (or a combination of agents) for connecting to a network, including, for example, a wireless transceiver, a modem, or an Ethernet connection.

It should be understood that the computing device 1101 is illustrated as an example only, and not intended to be limitative. Embodiments of this application may be implemented by using one or more computing devices. The one or more computing devices include components of the computing device 1101 shown in FIG. 11 or an alternative combination of the components (including components not shown in FIG. 11). For example, various embodiments of this application may be implemented by using a multi-processor computer, a plurality of single and/or multiprocessor computers arranged in a network, or a specific combination of both.

In one embodiment, in a resonator apparatus having an inductive element and a capacitive element, the inductive element includes a tapped inductor, the tapped inductor includes four terminals, two of the four terminals are coupled to differential inputs of a first amplifier and differential outputs of a second amplifier, and the other two terminals are coupled to differential outputs of the first amplifier. The first amplifier and the second amplifier can be switched by using switches, and the oscillator circuit can operate in inductive feedback mode or negative resistance mode through switching.

In another embodiment, a computer apparatus includes a storage apparatus for storing computer instructions having photomask data, to manufacture an oscillator including a resonator apparatus. In a resonator apparatus having an inductive element and a capacitive element, the inductive element includes a tapped inductor, the tapped inductor includes four terminals, two of the four terminals are coupled to differential inputs of a first amplifier and differential outputs of a second amplifier, and the other two terminals are coupled to differential outputs of the first amplifier. The first amplifier and the second amplifier can be switched by using switches, and the oscillator circuit can operate in inductive feedback mode or negative resistance mode through switching.

In yet another embodiment, a floorplanning apparatus includes logic for defining or assigning a gross region on the integrated circuit and for defining input/output (I/O) pins.

The floorplanning apparatus includes hard core (such as array, analog block, or inductor) placing apparatus for placing within the gross region based on design constraints (such as a trace length and timing). A clock wiring and placing apparatus (commonly referred to as a clock tree) is configured to place clocks and route connections between gates/analog blocks. A global and detailed routing apparatus is configured to design connections to connect all the elements together.

A physical design verification apparatus that includes a design rule checking apparatus is configured to verify whether physical design of the circuit (for example, an ASIC) satisfies one or more design rules. The design rules specify certain geometric and connectivity restrictions to ensure sufficient margins to account for variability in semiconductor manufacturing processes, to ensure that the ASICs work normally. A layout versus schematic (LVS) apparatus is configured to verify that physical layout corresponds to an original schematic or circuit diagram of the design. A simulation apparatus is configured to perform complete simulation, to ensure the layout phase is appropriately completed.

A tapeout apparatus is configured to generate mask generation design data typically manifested in a form of GDSII data structures for preparation of photomasks. The GDSII data structures are transferred through a communication medium (for example, a memory or network) from a circuit designer to either a photomask supplier/manufacturer or directly to a semiconductor foundry. A photomask creation apparatus creates a photomask for manufacturing an ASIC in accordance with principles of this application. Among other features, it should be understood that the foregoing described apparatuses are configured as appropriate to generate resonator and amplification apparatuses as described and claimed herein.

Some of the technologies described in this specification may be implemented by software stored on one or more computer-readable storage media and executed on a computer. The selected technologies may be executed on a single computer or a computer networked with another computer or computers. For clarity, only those aspects of tools or computer germane to the disclosed technologies are described. Product details well known in the art may be omitted.

Although features and elements are described above in particular combinations, each feature or element can be used alone without the other features and elements or in various combinations with or without other features and elements. Examples of computer-readable storage media include a read-only memory (ROM), a random access memory (RAM), a register, a cache memory, a semiconductor memory device, magnetic media such as an internal hard disk and a removable disk, a magneto-optical medium, an optical medium such as a CD-ROM disk, and a digital versatile disk (DVD).

While this application has described certain embodiments and generally associated methods, alterations and permutations of these embodiments and methods are clear to a person skilled in the art. In particular, it should be noted that while this application has been described in the context of CMOS amplifiers, a person skilled in the art figures out application to PMOS and NMOS amplifiers, bipolar amplifiers, and other suitable topologies without departing from the scope of this application. This application is applicable to almost all communication systems. For example, this application may be used in cellular transceivers, two-way radio communications, Wi-Fi applications, satellite receivers, and any application that uses a voltage controlled oscillator.

It should be noted that, embodiments of this application and the accompanying drawings are merely examples. Each MOS transistor in any embodiment or accompanying drawing may be a single MOS transistor that satisfies a required startup gain or a required on-current; or may be a MOS transistor combination that is formed by connecting a plurality of MOS transistors in parallel and that satisfies the required startup gain or the required on-current, that is, a sum of startup gains corresponding to the plurality of MOS transistors is greater than or equal to the required startup gain. Each capacitor in embodiments of this application may be one capacitor that satisfies a required capacitance; or may be a capacitor combination that is formed by connecting a plurality of capacitors in parallel or in series and that satisfies the required capacitance, that is, a corresponding capacitance obtained after the plurality of capacitors are connected in series or in parallel is equal to the required capacitance. Each inductor in embodiments of this application may be one inductor that satisfies a required inductance; or may be an inductor combination that is formed by connecting a plurality of inductors in series or in parallel and that satisfies the required inductance. Each resistor in embodiments of this application may be one resistor that satisfies a required resistance; or may be a resistor combination that is formed by connecting a plurality of resistors in parallel or in series and that satisfies the required resistance, that is, a corresponding resistance obtained after the plurality of resistors are connected in series or in parallel is equal to the required resistance.

In conclusion, the foregoing descriptions are merely embodiments of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. An oscillator circuit, comprising:
  a first amplifier and a second amplifier, wherein the first amplifier and the second amplifier can be switched by using switches; and
  a resonator, comprising a capacitive element and an inductive element, wherein the inductive element comprises a tapped inductor, the tapped inductor comprises one or more conductive segments forming a physical loop and a first and second tapped segments coupled to the physical loop, the physical loop has a first terminal and a fourth terminal that are coupled to differential inputs of the first amplifier and differential outputs of the second amplifier, and the first tapped segment has a second terminal and the second tapped segment has a third terminal, the second terminal and the third terminal are coupled to differential outputs of the first amplifier, the differential outputs of the second amplifier are cross-coupled to differential inputs of the second amplifier.

2. The circuit according to claim 1, wherein the first amplifier comprises a first MOS transistor, a second MOS transistor, a first switch, and a second switch, wherein the first MOS transistor and the second MOS transistor are both PMOS transistors or NMOS transistors; and
  a gate of the first MOS transistor is coupled to the first terminal, a drain of the first MOS transistor is coupled to the third terminal, a drain of the second MOS transistor is coupled to the second terminal, a gate of the second MOS transistor is coupled to the fourth terminal, and sources of the first MOS transistor and the second MOS transistor are coupled to a positive power voltage or a negative power voltage through the first switch and the second switch respectively.

3. The circuit according to claim 1, wherein the second amplifier is configured to enable the oscillator circuit to operate in a single-ended negative resistance mode.

4. The circuit according to claim 3, wherein the second amplifier comprises a third MOS transistor, a fourth MOS transistor, a fifth switch, and a sixth switch, wherein the third MOS transistor and the fourth MOS transistor are both PMOS transistors or NMOS transistors; and a drain of the third MOS transistor is coupled to a gate of the fourth MOS transistor through the fifth switch and coupled to the first terminal, a drain of the fourth MOS transistor is coupled to a gate of the third MOS transistor through the sixth switch and coupled to the fourth terminal, and a source of the third MOS transistor and a source of the fourth MOS transistor are both coupled to the positive power voltage or the negative power voltage.

5. The circuit according to claim 1, wherein the second amplifier is configured to enable the oscillator circuit to operate in a complementary negative resistance mode.

6. The circuit according to claim 5, wherein the second amplifier comprises two groups of second coupling transistors with gates and drains cross-coupled, the drains are coupled by using switches, and sources of the two groups of second coupling transistors are respectively coupled to the positive power voltage and the negative power voltage.

7. The circuit according to claim 6, wherein the second amplifier comprises a third PMOS transistor, a fourth PMOS transistor, a third NMOS transistor, a fourth NMOS transistor, a fifth switch, a sixth switch, a seventh switch, and an eighth switch, wherein a drain of the third PMOS transistor is coupled to a gate of the fourth PMOS transistor through the fifth switch and coupled to the first terminal, a drain of the fourth PMOS transistor is coupled to a gate of the third PMOS transistor through the sixth switch and coupled to the fourth terminal, a source of the third PMOS transistor and a source of the fourth PMOS transistor are both coupled to the positive power voltage, a drain of the third NMOS transistor is coupled to a gate of the fourth NMOS transistor through the seventh switch and coupled to the first terminal, a drain of the fourth NMOS transistor is coupled to a gate of the third NMOS transistor through the eighth switch and coupled to the fourth terminal, and a source of the third NMOS transistor and a source of the fourth NMOS transistor are both coupled to the negative power voltage.

8. The circuit according to claim 1, wherein for the first amplifier, a first impedance is formed between the first terminal and the fourth terminal, a second impedance is formed between the second terminal and the third terminal, an input voltage at the input of the first amplifier is greater than an output voltage determined by a voltage divider, and the voltage divider is constituted by the first impedance and the second impedance.

9. The circuit according to claim 8, wherein the input voltage exceeds a supply voltage of the first amplifier.

10. The circuit according to claim 1, wherein the tapped inductor comprises two tapped segments, the two tapped segments are located at the second terminal and the fourth terminal respectively, and the two tapped segments are routed in the middle of the tapped inductor.

11. The circuit according to claim 1, wherein the first amplifier comprises two groups of first coupling transistors with gates coupled together and drains coupled together, and sources of the two groups of first coupling transistors are respectively coupled to a positive power voltage and a negative power voltage through switches.

12. The circuit according to claim 11, wherein the first amplifier comprises a first PMOS transistor, a second PMOS transistor, a first NMOS transistor, a second NMOS transistor, a first switch, a second switch, a third switch, and a fourth switch, wherein a gate of the first PMOS transistor and a gate of the first NMOS transistor are both coupled to the first terminal, a drain of the first PMOS transistor and a drain of the first NMOS transistor are both coupled to the third terminal, a drain of the second PMOS transistor and a drain of the second NMOS transistor are both coupled to the second terminal, a gate of the second PMOS transistor and a gate of the second NMOS transistor are both coupled to the fourth terminal, a source of the first PMOS transistor and a source of the second PMOS transistor are coupled to the positive power voltage through the first switch and the second switch respectively, and a source of the first NMOS transistor and a source of the second NMOS transistor are coupled to the negative power voltage through the third switch and the fourth switch respectively.

13. An oscillator circuit, comprising:

a first amplifier and a second amplifier, wherein the first amplifier and the second amplifier are configured to be switched such that the oscillator circuit can operate in an inductive feedback mode or a negative resistance mode through switching, wherein the first amplifier comprises two groups of first coupling transistors with gates coupled together and drains coupled together, and sources of the two groups of first coupling transistors are respectively coupled to a positive power voltage and a negative power voltage through switches;

a resonator, comprising a capacitive element and an inductive element, wherein the inductive element comprises a tapped inductor, the tapped inductor comprises four terminals including a first terminal, a second terminal, a third terminal, and a fourth terminal, two of the four terminals are coupled to differential inputs of the first amplifier and differential outputs of the second amplifier, and the other two terminals are coupled to differential outputs of the first amplifier.

14. The circuit according to claim 13, wherein the first amplifier comprises a first PMOS transistor, a second PMOS transistor, a first NMOS transistor, a second NMOS transistor, a first switch, a second switch, a third switch, and a fourth switch, wherein a gate of the first PMOS transistor and a gate of the first NMOS transistor are both coupled to the first terminal, a drain of the first PMOS transistor and a drain of the first NMOS transistor are both coupled to the third terminal, a drain of the second PMOS transistor and a drain of the second NMOS transistor are both coupled to the second terminal, a gate of the second PMOS transistor and a gate of the second NMOS transistor are both coupled to the fourth terminal, a source of the first PMOS transistor and a source of the second PMOS transistor are coupled to the positive power voltage through the first switch and the second switch respectively, and a source of the first NMOS transistor and a source of the second NMOS transistor are coupled to the negative power voltage through the third switch and the fourth switch respectively.

15. A non-transitory computer-readable medium for use with a computer, wherein the non-transitory computer-readable medium has software for creating an integrated circuit, the computer-readable medium having one or more computer-readable data structures stored thereon, and the one or more computer readable data structures have optical mask data for manufacturing an oscillator circuit, wherein the oscillator circuit, comprising:

a first amplifier and a second amplifier, wherein the first amplifier and the second amplifier are configured to be switched by using switches; and a resonator, comprising a capacitive element and an inductive element, wherein the inductive element comprises a tapped inductor, the tapped inductor comprises one or more conductive segments forming a physical loop and a first and second tapped segments coupled to the physical loop, the physical loop has a first terminal and a fourth terminal that are coupled to differential inputs of the first amplifier and differential outputs of the second amplifier, and wherein the first tapped segment has a second terminal and the second tapped segment has a third terminal, the second terminal and the third terminal are coupled to differential outputs of the first amplifier, the differential outputs of the second amplifier are cross-coupled to differential inputs of the second amplifier.

* * * * *